United States Patent
Rao

(10) Patent No.: US 7,254,690 B2
(45) Date of Patent: Aug. 7, 2007

(54) PIPELINED SEMICONDUCTOR MEMORIES AND SYSTEMS

(75) Inventor: G.R. Mohan Rao, McKinney, TX (US)

(73) Assignee: S. Aqua Semiconductor LLC, Wilmington, DE (US)

( * ) Notice: Subject to any disclaimer, the term of this patent is extended or adjusted under 35 U.S.C. 154(b) by 358 days.

(21) Appl. No.: 10/850,719

(22) Filed: May 20, 2004

(65) Prior Publication Data

US 2004/0243781 A1 Dec. 2, 2004

Related U.S. Application Data

(60) Provisional application No. 60/475,224, filed on Jun. 2, 2003.

(51) Int. Cl.
*G06F 12/00* (2006.01)

(52) U.S. Cl. .............. 711/169; 711/100; 711/167; 710/1; 710/3; 710/4; 710/26; 365/230.01; 365/230.03; 365/230.04; 365/230.09

(58) Field of Classification Search ......... 711/169, 711/167, 170, 100; 710/1, 3, 4, 26; 365/230.01, 365/230.03, 230.04, 230.09
See application file for complete search history.

(56) References Cited

U.S. PATENT DOCUMENTS

| | | | |
|---|---|---|---|
| 4,646,266 A | | 2/1987 | Ovshinsky et al. |
| 5,835,932 A | | 11/1998 | Rao |
| 5,896,312 A | | 4/1999 | Kozicki et al. |
| 5,963,504 A | * | 10/1999 | Manning .............. 365/233.5 |
| 6,360,307 B1 | * | 3/2002 | Raftery et al. .............. 711/169 |
| 6,427,197 B1 | * | 7/2002 | Sato et al. .............. 711/169 |
| 6,625,686 B2 | | 9/2003 | Hasegawa et al. |
| 6,643,165 B2 | | 11/2003 | Segal et al. |
| 6,661,721 B2 | * | 12/2003 | Lehmann et al. .......... 365/203 |
| 6,665,231 B2 | | 12/2003 | Mizuno et al. |
| 6,681,302 B2 | | 1/2004 | Cho et al. |
| 6,690,377 B2 | | 2/2004 | Tuomi |
| 6,724,665 B2 | | 4/2004 | Scheuerlein et al. |
| 6,728,161 B1 | | 4/2004 | Roohparvar |
| 6,728,798 B1 | | 4/2004 | Roohparvar |
| 6,728,819 B2 | | 4/2004 | Farmwald et al. |
| 6,728,838 B2 | | 4/2004 | Chauvel et al. |
| 6,728,845 B2 | | 4/2004 | Adiletta et al. |
| 7,047,385 B1 | * | 5/2006 | Bhattacharya et al. ...... 711/169 |

(Continued)

OTHER PUBLICATIONS

Patterson, et al.; "Pipelining", Chapter 3: Computer Architecture: A Quantitative Approach; , 2nd Edition, Morgan Kaufmann Publishers, 1996.

(Continued)

*Primary Examiner*—Stephen C. Elmore
*Assistant Examiner*—Daniel Kim
(74) *Attorney, Agent, or Firm*—Schwabe, Williamson & Wyatt, P.C.

(57) ABSTRACT

The invention describes and provides pipelining of addresses to memory products. Addresses are pipelined to multibank memories on both rising and falling edges of a clock. Global Address Supervisor pipelines these addresses optimally without causing bank or block or subarray operational conflicts. Enhanced data through put and bandwidth, as well as substantially improved bus utilization (simultaneously), can be realized. In peer-to-peer connected systems, significant random data access throughput can be obtained.

8 Claims, 4 Drawing Sheets

New Bank architecture with SRAM registers

When a Bank is available (namely, completed precharge, and ready for ACTIVE Command) the appropriate execution for READ or WRITE is preformed in sequence directly from the SRAM registers. All the addresses/commands/controls are from the SRAM registers. All the addresses/commands/controls are from the SRAM association - the DRAM has no direct interface to the external electronic system, memory controller or other IC'S.

U.S. PATENT DOCUMENTS

| | | | |
|---|---|---|---|
| 7,062,587 B2* | 6/2006 | Zaidi et al. | 710/305 |
| 2002/0038415 A1* | 3/2002 | Zandveld et al. | 712/206 |
| 2002/0133665 A1* | 9/2002 | Mailloux et al. | 711/105 |
| 2003/0074517 A1* | 4/2003 | Nicolai | 711/5 |

OTHER PUBLICATIONS

Patterson, et al.; "Enhanced Performance with Pipelining"; Chapter 6: Computer Organization and Design; Morgan Kaufmann Publishers, 1994.

Elpida Memory Inc.; 1GB Unbuffered DDR2 SDRAM DIMM, EBE11UDSABFA (128M words x 64 bits, 2 ranks) Preliminary Data Sheet, Jun. 2003.

Simtek; STK10C68 8K x 8 nvSRAM, Nonvolatile Static RAM; Document Control No. ML0006, Rev. 0.1; Sep. 2003.

Rauntron International Corporation; FM 1608, 64Kb Byte Wide FRAM Memory; Datasheet; Jun. 2002.

Tseng, et al; Monolithic Integration of Carbon Nanotube Devices with Silicon MOS Technology; Nano Letters, 2004, vol. 4, No. 1, pp. 123-127.

EE Times on Line; Motorola Speeds MRAM to Market; Oct. 24, 2003.

Cravotta; Chip-to-Chip Internconnect; EDN, Apr. 1, 2004; pp. 41-46.

ISSI Advanced Information; 256K x 18 Synchronous Pipelined Static RAM; IS61SP25618; May 1998.

Kilbuck; FCRAM 101 Part 2: Applying FCRAM's to OC-192; Communications Design On Line, Mar. 26, 2002.

Iyer, et al.; Analysis of a Memory Architecture for Fast Packet Buffers; IEEE Workshop on High Performance Switching and Routing, Dallas, Texas, May 2001.

Samsung, K9F2G 16 VOM, 256M x 8 bits/NAND 128M x 16 Bits Flash Memory Data Sheet, 2004.

Comms Design on Line; Broadcom Retasks SOC for Docsis V 2.0 Duties; May 3, 2004.

EE Times on Line; TSMC Prepares MIM Memory at 90-nm Mode; Apr. 29, 2004.

New Scientist.com; Plastic Memory Promises Cheap, Dense Storage; Nov. 13, 2003.

* cited by examiner

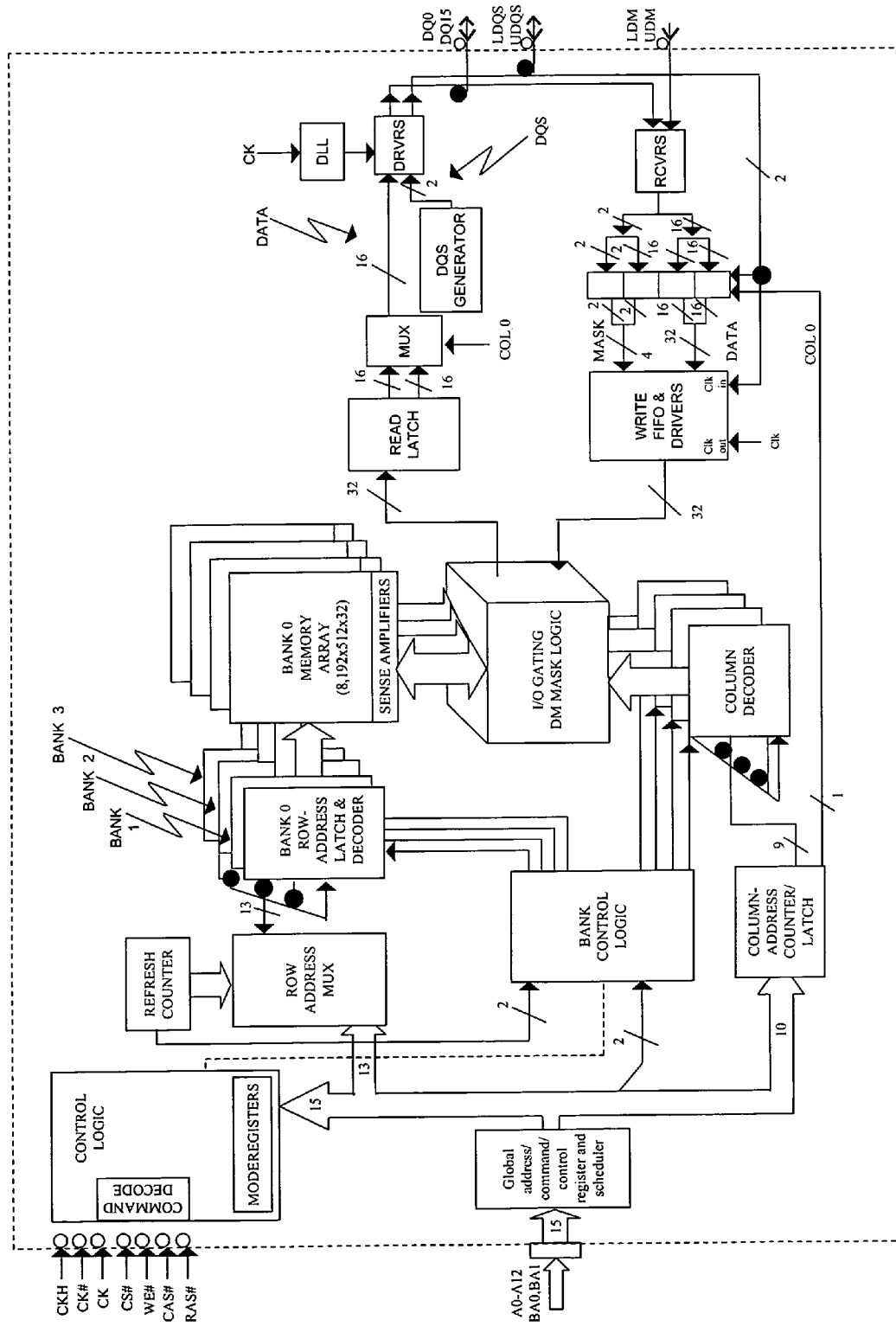

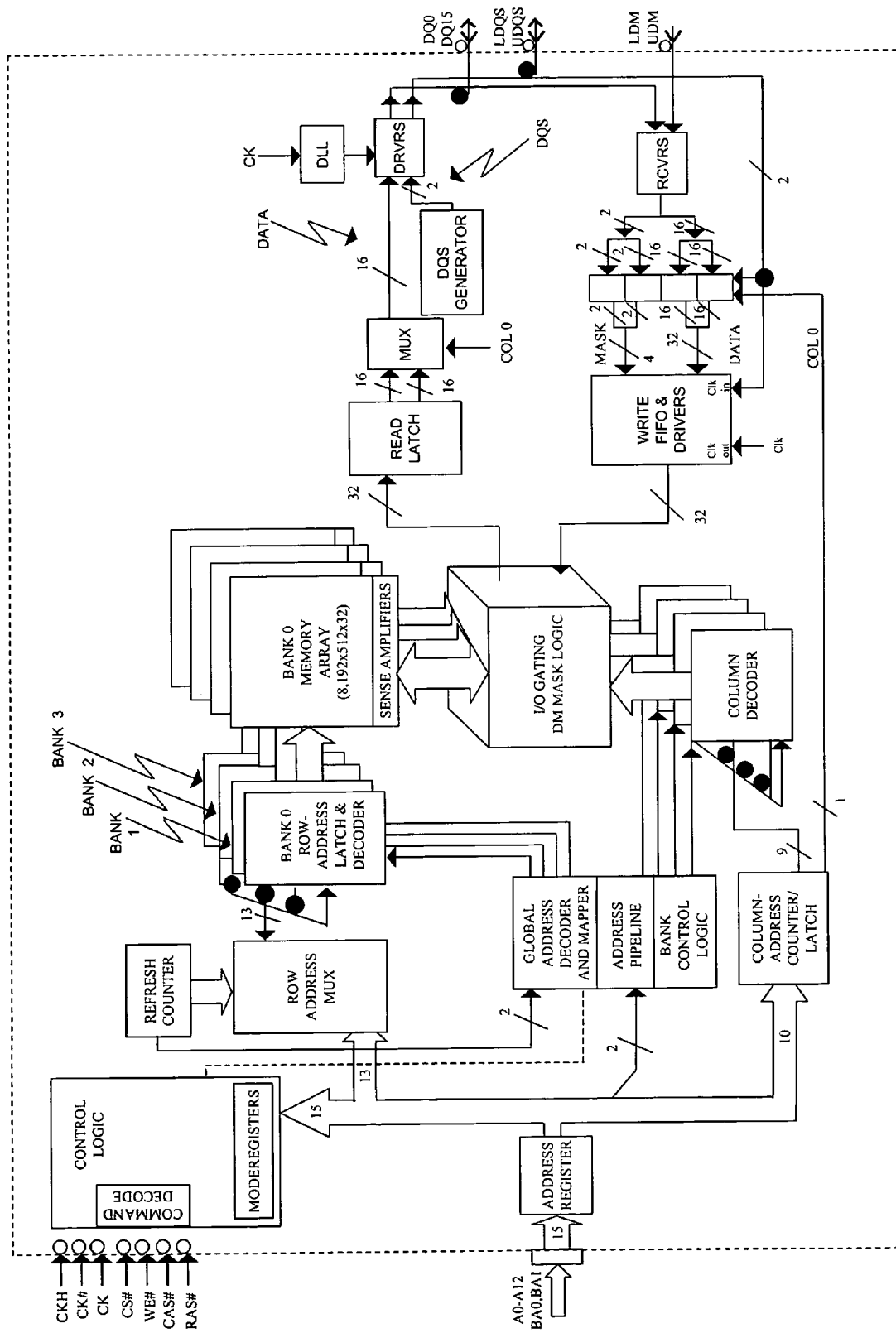
FIG. 2 FUNCTIONAL BLOCK DIAGRAM 32 MEG x 16-INVENTION

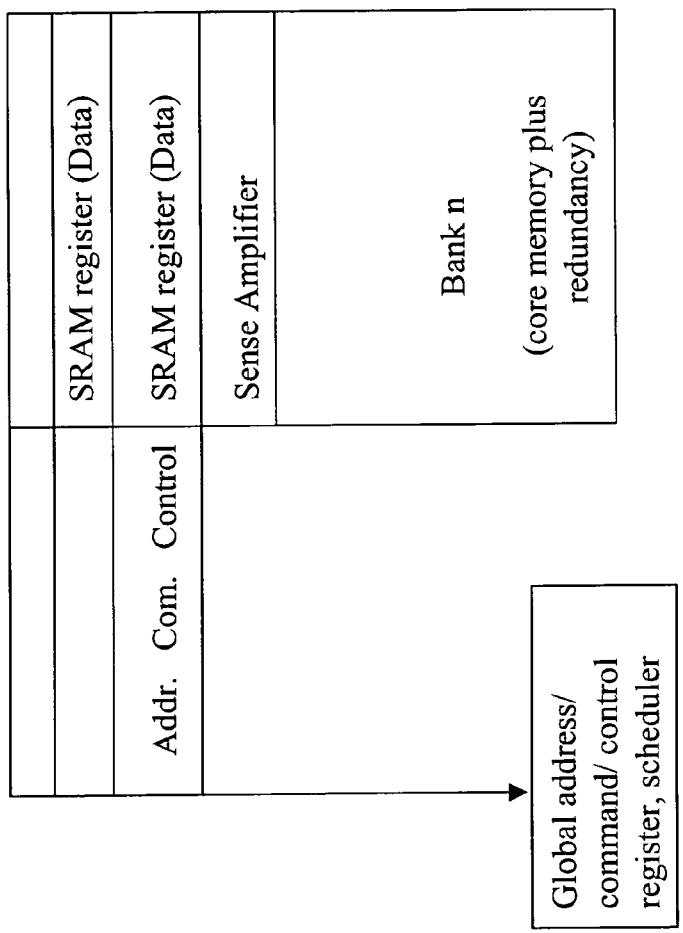

FIG. 3 New Bank architecture with SRAM registers

When a Bank is available (namely, completed precharge, and ready for ACTIVE Command) the appropriate execution for READ or WRITE is preformed in sequence directly from the SRAM registers. All the addresses/commands/controls are from the SRAM registers. All the addresses/commands/controls are from the SRAM association - the DRAM has no direct interface to the external electronic system, memory controller or other IC'S.

FIG. 4 SRAM registers coupled with FIFO'S in each bank

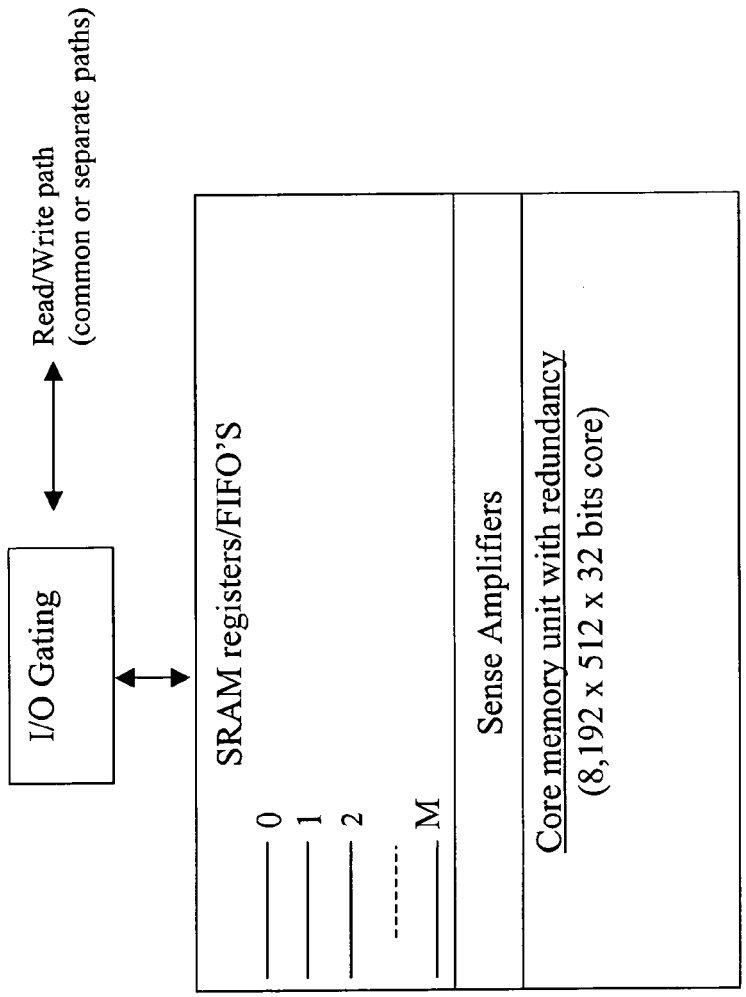

Separate READ DATA, and, WRITE DATA paths enhance the random access time of the bank, for an external interface. SRAM registers/FIFO'S can act as high speed data buffers to the relatively slow DRAM core. The number of SRAM registers can be as small as two (one for READ and one for WRITE) or, even longer based on the intelligence/ flexibility of the external memory controller.

PIPELINED SEMICONDUCTOR MEMORIES AND SYSTEMS

CROSS-REFERENCE TO RELATED APPLICATION

The Patent Application claims priority to provisional patent Application Ser. No. 60/475,224 entitled "Pipelined Semiconductor Memories" filed Jun. 2, 2003 by inventor G. R. Mohan Rao.

FIELD OF INVENTION

The present invention relates in general to electronic systems comprising semiconductor integrated circuits. It relates in particular to pipelined memories in standalone (discrete) as well as embedded (system-on-chip, system-in-package) implementations.

BACKGROUND OF THE INVENTION

Peak data bandwidth, average data bandwidth, fast bus turnaround, maximum bus utilization and efficiency, low power, nonvolatility—all at an affordable cost—are key requirements for semiconductor components. Specifically, for semiconductor memories, there are additional requirements as well. For example, balanced read/write operational efficiency in communication systems, is necessary. In some systems dominated by 'page' architectures (DRAM, Flash are some examples), multiple open pages improves system efficiency. Since memory integrated circuits are used in large numbers in electronic systems, their ability to function efficiently in bus architectures, as well as peak-to-peak architectures is desirable.

Most memories, at the core, are two-dimensional arrays of rows and columns. DRAMS, Flash, SRAMs, EEPROMS, Ferroelectric memories, Magnetic RAMS, nanotube RAM's (carbon nanotube is one example), molecular memories, phase change memories and organic memories etc. Each of these memories serve a particular application satisfying the requirements of that particular application. Although, all these memories are Read and Write memories, each application requires focus on a particular parameter. 'Open page' applications (Personal Computers, Servers for example) require fast data with a given page (or predetermined set/sets of columns)—Rambus™, DDR (double data rate), QDR (quad data rate), FCRAM™, RLDRAM™ (reduced latency) are serving those requirements. ZBTSRAM™ serves some specific needs in wired communication systems. Pseudo static RAM'S, nonvolatile SRAM'S, MIM (metal-insulator-metal) RAM'S are finding acceptance in portable electronic systems like cellular phones.

SUMMARY OF THE INVENTION

All of the above memories without an exception, desire fast data throughput at low cost and low power. Although data pipelining and prefetching from the memory core have been described in prior art, address pipelining in general, bank/block/sector/row/subarray and address pipelining in particular, have not been attempted. It is one embodiment of the invention to pipeline all addresses at the same rate as data, independent of the address function (row, column, bank, block, sector). It is another embodiment of the invention to pipeline those addresses on both the rising and falling edges of SCLK (System clock) or a primary clock for that particular system or IC. It is yet another purpose and embodiment of the invention to provide a global command and control supervisory circuitry for each monolithic integrated circuit that optimizes the efficiency of a multi bank/block/sector IC. The word "bank" is used here, synonymously with block, sector, subarray etc. It is also another embodiment to pipeline addresses at a rate faster than data, or, even slower than data in an asynchronous manner.

Although preferred embodiments are described in this invention, the implementation and extension of the principles of the invention are not limited. For those skilled in the art, the principles described in this invention will be obvious. The principles of the present invention are embodied in memory system architectures and operating methods utilizing multiple banks (blocks, sectors, subarrays) and independent row/column address decoding pipeline. A memory is disclosed where a plurality of independently addressable banks for storing data can function with a decoding pipeline of n-stages where n is greater than 1, and at least 2. The "unit" is one system or primary clock (SCLK, CLK) period. Row and column addresses can be continuously pipelined from the address input parts. Global address supervisory circuitry allows a sequence of addresses to be continuously received, and, properly implemented, without conflict at any stage.

BRIEF DESCRIPTION OF THE DRAWINGS

FIG. 1 is a functional block diagram of a 32 Meg×16 double data rate synchronous RAM (memory) incorporating some of the inventions like global supervisory control described in this patent.

FIG. 2 is a functional block diagram of a 32 Meg×16 memory with additional embodiments of the invention where the global supervisory control specifically focuses on the bank and row address path.

FIG. 3 is a functional block diagram of a memory system/IC where an SRAM buffer/register between the memory core (can be any memory, DRAM core is shown as an example only) and peripheral circuitry (address, command, control and clocks).

FIG. 4 is a functional block diagram of a memory system/IC where the READ and WRITE data paths are separately gated to the core memory.

DETAILED DESCRIPTION OF THE INVENTION

The principles of the present invention and their advantages are best understood by referring to the illustrated embodiments depicted in FIGS. 1-4 of the drawings, in which like numbers designate like parts. The inventions described below apply to any memory, namely, DRAM, SRAM, EPROM, EEPROM, Flash, Mag RAM, FeRAM, PCRAM, plastic RAM, CNTRAM, Molecular RAM etc. The inventions apply to both non-multiplexed address as well as multiplexed-address integrated circuits. The inventions described below apply to what is known in the industry as "row" chain—namely, selecting block/bank/sector/subarray/row in any IC (integrated circuit) or system (consisting of several IC's) or SOC (System On Chip). The inventions apply to single-ended or rail-to-rail address/data/clock signals. The inventions apply to the "column" chain as well. The inventions apply to "data bursts", "prefetch schemes", "page schemes" and similar architectures known in the industry. The effective bandwidth of a device can be enhanced 2 to 4× or even more, by using these inventions, with minimal cost.

The time line sequence of events in a monolithic commercial multi-bank synchronous DRAM (generally speaking)—a 512 Mb DRAM, organized as 32 Mb×16, for example is described below (a clock, a command, a control are given, in addition to the addresses, to access one or more sets of memory locations). For simplicity's sake, we shall describe these in 'clock units' (1 unit is one master clock period). Assume all banks have been precharged before the memory access cycle begins (it is assumed and understood that MODE registers, defining specific device operational choices are set appropriately):

a) Addresses are received, appropriately level shifted/converted after detection (on chip)
b) Bank selection is made
c) Row address is streered to the selected bank
d) Row address is decoded (to select 1 of n rows) in the specific bank (assumes proper subarray is selected, if necessary)
e) Word line is activated
f) Signal from all storage cells (memory cells) in the related row, are detected and amplified by the sense amplifier (for a read operation in a dynamic cell, appropriate digital level is written instead of RESTORE)
g) Column start address is selected, data prefetched in the 'burst order' defined (activation of column address select can be posted earlier; 'posted CAS' as is well known in the industry)
h) If the command is READ, appropriate data is sent to output buffers (depending on data fetch schemes, DDR or QDR is employed
i) If the command is WRITE, appropriate data is received from the input buffers (level shifted and amplified as needed) is coupled to appropriate lines of columns at the sense amplifiers
j) RESTORE is performed if a memory core requires that function, automatically, as a part of the READ
k) Page is left open for further READ/WRITE operations into the same PAGE (usually one Page is equal to one row of data). As is well known in the industry, nonvolatile memory IC's also used PAGE driven architecture, by employing an SRAM buffer.

In the case of RLDRAM (reduced latency DRAM), the banks are cycled in sequence and the PAGE in the previously accessed bank is closed in each bank as the cycling starts to a new bank access.

Precharge is not required for 6TSRAM's, Flash nonvolatile memories and similar memory cores. Precharge is required PSRAM's (pseudo static RAM's) as is know in the industry. The above 'time sequence' varies for memory type, namely, DRAM, SRAM, flash etc.

The critical paths of 'row access' and 'column access' dictate the 'access time' of each memory. In today's popular memory products (DRAM's, SRAM's, flash), although the memory may be in multiple banks in the same monolithic chip, the peripheral circuitry (internal clocks, data paths to the external media) is common. This limitation, significantly, impedes access speed. For example, while one 'row' (wordline) is ON, the next row address for access can be waiting in line without turning ON the wordline. As illustrated in FIG. 1, the invention highlights what has not been shown in prior art. Firstly, addresses are toggled on both raising and falling edges of the CLK. Effectively, this doubles the rate (speed) at which addresses can be funneled into the IC, compared to prior art. Secondly, all incoming addresses (after level shifting and amplification, as necessary) directly go to the Global Address Supervisor (global address/command/control register and scheduler). Such an architectural item is not know in the industry, nor implemented in any of the IC's (DRAM, SRAM, flash, NVSRAM). The Global Address supervisor, in this invention, performs some of the following tasks:

1) it steers the address to the designated bank (if a DRAM or SRAM) or block/sector (if Flash memory) or similar memory array unit as used by memory IC's.
2) it has the ability to map, if required, addresses, or sequence the addresses appropriately, to avoid bank/block/sector/subarray/row conflicts
3) if a BANK is busy, it has the ability to hold the addresses in a STAGING area temporarily, and release that address to that bank at the appropriate time without causing device malfunction. This increases bus utilization time.

The Global Address Supervisor is shown in FIGS. 1 and 2. Whereas FIG. 1 highlights the invention for a multiplexed address DRAM, FIG. 2 shows the implementation of this invention to any memory (not limited to DRAM). The staging area for the addresses—row, column or whatever—can be implemented either with SRAM like latches (set/release latches) or similar digital logic circuitry well known in the industry. Such isolation latches can also be used in various stages of clocked circuitry, where needed in the row path as well as column path.

It should be obvious that the peak as well as average bandwidth of the memory IC or system can be doubled, with minimal cost. By employing separate READ and WRITE access port, the bandwidth can be increased even further. By employing FIFO'S (FIRST IN, FIRST OUT) in the WRITE path, one can further enhance performance in specific application like packet buffering (where the INCOMING PACKET QUEUE is well defined, where as the OUTGOING PACKET QUEUE is mostly random).

Yet another embodiment of the invention is illustrated in FIG. 3. Using an SRAM as the interface between memory core/sense amplifiers and data path circuitry further enhances random access latency and bus turn around time. FIG. 3 illustrates such a preferred embodiment bank architecture. These SRAM registers can be staging areas for the INGRESS and EGRESS of data (packets or other forms). The Global Address Supervisor interacts with the SRAM registers when the BANK is available to enhance performance further. All addresses/commands/controls are from SRAM registers, as shown in FIG. 3. When the memory core is flash, such SRAM registers are already available (see references) so that this invention enhances performance without additional cost to the user.

Yet another embodiment is shown in FIG. 4 where the READ and WRITE data paths are separated (individualized). Such separate data path architecture enhances random access performance, as well as double the data throughput (especially for balanced Read/Write schemes in communication applications). The number of SRAM registers (buffers) can be increased, to maintain multiple open pages as well.

While particular embodiments of the inventions have been shown and described, changes and modifications may be made there in without departing from the inventions in their broader aspects. Therefore, the aim in the appended claims to cover all such changes and modifications as fall within the true spirit and scope of the basic invention.

What is claimed:
1. A semiconductor memory device, comprising:
a plurality of independently addressable banks for storing data;
a Global Address Supervisor coupled to said plurality of independently addressable banks for storing data, wherein said Global Address Supervisor is configured to continuously receive a sequence of row and column addresses, wherein said continuously received row and column addresses are toggled on both rising and falling edges of a clock signal, wherein said Global Address Supervisor is configured to select one of said plurality of independently addressable banks based on a received row address, wherein said Global Address Supervisor is configured to map said continuously received row and column addresses to a particular bank of said plurality of independently addressable banks in a manner that avoids bank conflicts.

2. The semiconductor memory device as recited in claim 1, wherein if said particular bank of said plurality of independently addressable banks is unavailable, then said Global Address Supervisor is configured to hold an address that is addressable to said particular bank in a staging area.

3. The semiconductor memory device as recited in claim 2, wherein said Global Address Supervisor is further configured to release said address held in said staging area to said particular bank of said plurality of independently addressable banks after said particular bank becomes available.

4. The semiconductor memory device as recited in claim 1, wherein said row and column addresses are received on separate read and write busses.

5. A method for performing address pipelining comprising the steps of:

toggling a continuous sequence of row and column addresses on both rising and falling edges of a clock signal;

receiving said toggled sequence of row and column addresses;

selecting one of a plurality of independently addressable banks for storing data based on a received row address; and mapping said received toggled sequence of row and column addresses to a particular bank of said plurality of independently addressable banks in a manner that avoids bank conflicts.

6. The method as recited in claim 5 further comprising the step of:

holding an address that is addressable to said particular bank in a staging area if said particular bank of said plurality of independently addressable banks is unavailable.

7. The method as recited in claim 6 further comprising the step of:

releasing said address held in said staging area to said particular bank of said plurality of independently addressable banks after said particular bank becomes available.

8. The method as recited in claim 5, wherein said row and column addresses are received on separate read and write busses.

* * * * *